United States Patent [19]

Matloubian et al.

[11] Patent Number: 5,047,361
[45] Date of Patent: Sep. 10, 1991

[54] NMOS TRANSISTOR HAVING INVERSION LAYER SOURCE/DRAIN CONTACTS

[75] Inventors: Mishel Matloubian, Emeryville, Calif.; Cheng-Eng D. Chen, Richardson, Tex.

[73] Assignee: Texas Instruments Incorporated, Dallas, Tex.

[21] Appl. No.: 549,507

[22] Filed: Jul. 6, 1990

Related U.S. Application Data

[62] Division of Ser. No. 375,169, Jun. 30, 1990, Pat. No. 4,994,869.

[51] Int. Cl.$^5$ .......................................... H01L 21/265
[52] U.S. Cl. ...................................... 437/40; 437/17; 437/41; 437/44; 437/984; 357/23.3; 357/23.9
[58] Field of Search ................... 437/17, 984, 44, 41, 437/40; 357/23.3, 23.9

[56] References Cited

U.S. PATENT DOCUMENTS

| | | | |
|---|---|---|---|
| 3,442,721 | 5/1969 | McCaldin | 148/33 |
| 3,657,614 | 4/1972 | Cricchi | 317/235 R |
| 3,983,574 | 9/1976 | Statz et al. | 357/31 |
| 4,047,974 | 9/1977 | Harari | 148/1.5 |

Primary Examiner—Brian E. Hearn
Assistant Examiner—Kevin Picardat
Attorney, Agent, or Firm—Melvin Sharp; James T. Comfort; N. Rhys Merrett

[57] ABSTRACT

A transistor (42) is provided having a gate conductor (44) formed adjacent a semiconductor substrate (46) and separated therefrom by a gate insulator (48). Sidewall spacers (52, 54) are formed at the sides of gate conductor (44) and adjacent semiconductor substrate (46). Diffused regions (56, 58) are formed within semiconductor substrate (46) in order to provide source/drain regions for transistor (42). Positive charges from radiation are trapped within sidewall spacers (52, 54) thereby attracting negative charges from semiconductor substrate (46) such that a negative charge layer is created between diffused region (56) and gate edge (50a) and also between diffused region (58) and gate edge (50b).

16 Claims, 1 Drawing Sheet

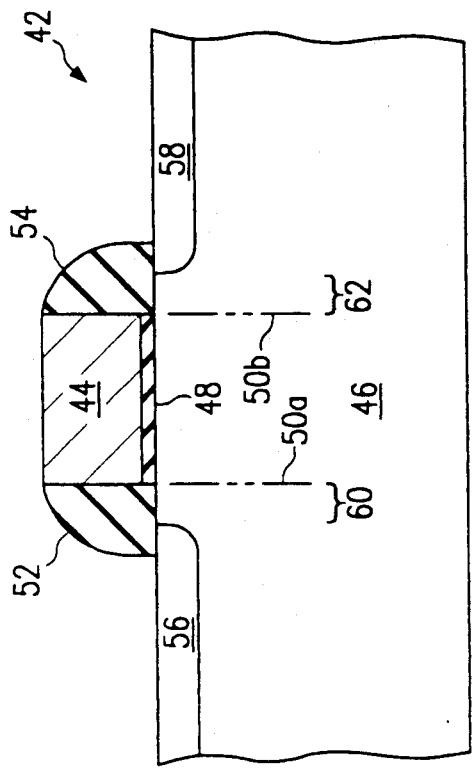
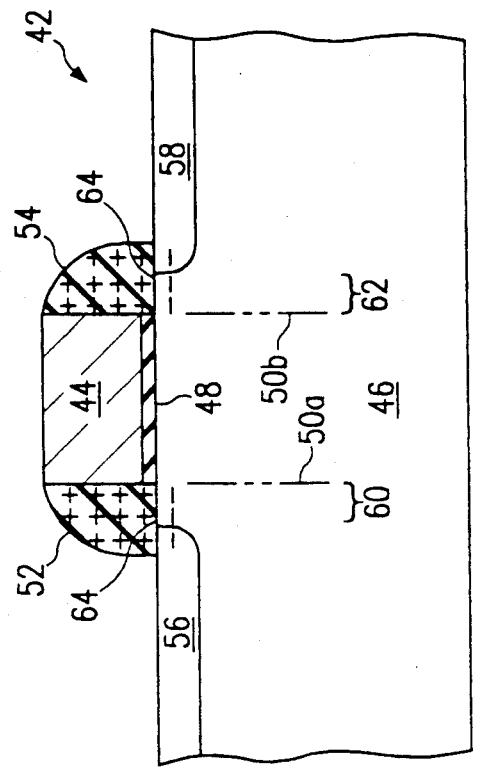
FIG. 2
FIG. 3
FIG. 1a (PRIOR ART)
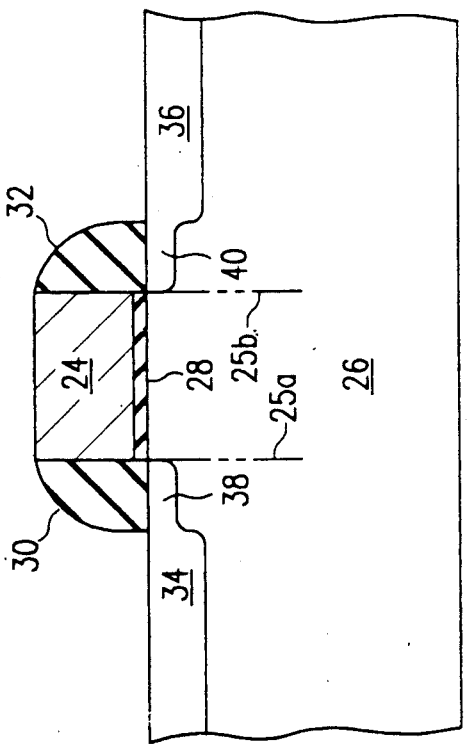
FIG. 1b (PRIOR ART)

5,047,361

NMOS TRANSISTOR HAVING INVERSION LAYER SOURCE/DRAIN CONTACTS

This is a division, of application Ser. No. 375,169, filed June 30, 1990, now U.S. Pat. No. 4,994,869.

TECHNICAL FIELD OF THE INVENTION

This invention relates to MOS transistors, and more particularly to an NMOS transistor having an inversion layer connecting the source/drain to the transistor gate edge.

BACKGROUND OF THE INVENTION

In silicon gate MOS technology optimal device characteristics are realized when the electrical channel length is equal to the length of the patterned gate. In other Words, optimum performance occurs when the source/drain regions are precisely aligned to the gate edge. As a result, it is desirable to construct MOS transistors in a manner to assure source/drain alignment with the gate edge.

Methods for constructing MOS transistors in the current art include both the reach-through and push-through processes. For shorter channel devices (i.e., channel less than 2 μm), push-through processing is typically used to contact the gate edge with the diffused regions In this process, doping is done self-aligned to the gate sidewall spacers. The dopants are subsequently diffused during the source/drain anneal in order to reach the gate edge. The anneal time and temperature are critical because, ideally, the source/drain dopants should just reach the gate edge. If too little diffusion occurs, then the source/drain will fail to reach the gate edge, which, in turn, leads to increased source/drain series resistance and reduced drive current. Alternatively, if too much diffusion occurs, then there is overlap of the source/drain and gate edge which leads to increased gate-to-source/drain capacitance, and decreased effective electrical channel length. Smaller effective channel length increases short channel effects such as punch-through and hot electron degradation.

Another method currently used in an effort to align the source/drain regions with the gate edge is the reach-through lightly doped drain profile. Under this methodology, a light source/drain dose is implanted self aligned to the gate edges. Thereafter, sidewall spacers are formed on the sides of the gate and the main source/drain regions are implanted. The lightly doped drain structure insures that there is no underlap between source/drain and the gate edge. However, this process does not solve the problem of too much diffusion which leads to overlap and the problems mentioned above.

Therefore, a need has arisen for a MOS transistor and the methodology of fabrication thereof which assures self-alignment between the source/drain regions and the gate edges of the transistor.

SUMMARY OF THE INVENTION

In accordance with the present invention, a transistor having accurate alignment between the source/drain region and gate edge is provided which substantially eliminates or reduces the disadvantages and problems associated with prior MOS transistors.

In accordance with the present invention, a transistor is provided which includes a semiconductor substrate and a gate conductor adjacent the substrate. The gate conductor defines first and second gate edges within the substrate. Also included within the transistor is a sidewall spacer adjacent the side of the gate conductor and over the surface of the semiconductor substrate. Positive charges are trapped within the sidewall spacer by radiation, such that a negative charge inversion layer is formed opposite the sidewall spacer. A diffused region is formed within the semiconductor substrate and may be away from the gate edge such that the inversion layer provides an electrical connection from the diffused region to the gate edge. Alternatively, the diffused region may contact the gate edge and have the inversion layer within the diffused region. The sidewall spacer may comprise an oxide sidewall spacer. The semiconductor substrate and the diffused region are of opposite conductivity types The present invention includes the technical advantage of providing an electrical channel length equal to the patterned gate length. As a result, there is the technical advantage of low source/drain series resistance. Another technical advantage of the present invention includes reduced short channel effects because the effective source/drain depth under the sidewall spacers is very small. Another technical advantage includes reduced series resistance due to the high conductivity of the inversion layer created opposite the transistor sidewall spacers. The present invention provides another technical advantage in reducing the number of steps necessary to fabricate the device in that no LDD implant is needed as is required in the art heretofore utilized in contacting the gate edge with the source/drain.

BRIEF DESCRIPTION OF THE DRAWINGS

For a more complete understanding of the present invention and the advantages thereof, reference is now made to the following descriptions taken in conjunction with the accompanying drawings, in which:

FIG. 1a illustrates a prior art transistor using the push-through source/drain process;

FIG. 1b illustrates a prior art transistor using LDD reach-through diffusion in order to connect the source/drain with the gate edge;

FIG. 2 illustrates the transistor of the present invention; and

FIG. 3 illustrates the transistor of the present invention having positive charge trapped in the sidewall spacers thereof.

DETAILED DESCRIPTION OF THE INVENTION

The preferred embodiment of the present invention is best understood by referring to FIG. 1-3 of the drawings, like numeral being used for like and corresponding parts of the various drawings.

FIG. 1a illustrates a prior art transistor constructed according to a push-through process. The transistor includes a semiconductor substrate 10 having a gate conductor 12 formed thereover. Gate conductor 12 defines gate edges 13a and 13b extending vertically within semiconductor substrate 10 and colinear with the sides of gate conductor 12. A gate insulator 14 is formed between semiconductor substrate 10 and gate conductor 12. Sidewall spacers 16 and 18 are formed at the sides of gate conductor 12 and adjacent semiconductor substrate 10. Diffused regions 20 and 22 are formed within semiconductor substrate 10 in order to provide source/drain regions for the transistor.

It is an object in the transistor art to insure that diffused regions 20 and 22 are ultimately bordered along gate edges 13a and 13b, respectively. The push-through process used to create the transistor of FIG. 1a is one method used in an effort to attain this goal. Initially, diffused regions 20 and 22 are vertically implanted to a depth on the order of 0.15 μm. Thereafter, the device is subjected to a high temperature annealing process over a set amount of time. As a result, the high temperature causes diffused regions 20 and 22 to expand both laterally and downwardly. Thus, the anneal process continues thereby causing diffused regions 20 and 22 to diffuse lateral d gate edges 13a and 13b, respectively.

Ideally, the anneal process is terminated at a point where diffused regions 20 and 22 precisely align with gate edges 13a and 13b. However, due to the difficulty in monitoring the extent of the diffusion, either underlap or overlap may occur where each diffused region either fails to reach or extends beyond the corresponding gate edge. Further, the downward diffusion results in a depth on the order of 0.30 μm for diffused regions 20 and 22. A larger depth of diffused regions 20 and 22 gives rise to problematic short-channel effects arising therefrom. Further, both diffused regions 20 and 22 will also provide an undesirable series resistance between the regions and gate edges 13a and 13b.

FIG. 1b illustrates a prior art transistor constructed according to the reach-through lightly doped drain ("LDD") process. A gate conductor 24 is formed over a semiconductor substrate 26 with a gate insulator 28 therebetween. Again, gate conductor 24 defines gate edges 25a and 25b extending downwardly within semiconductor substrate 26. Sidewall spacers 30 and 32 are formed along the sides of gate conductor 24 and adjacent semiconductor substrate 26. Diffused regions 34 and 36 are formed within semiconductor substrate 26 in order to provide the source/drain regions of the transistor. Lightly doped regions 38 and 40 are formed within diffused regions 34 and 36, respectively.

Lightly doped regions 38 and 40 are implanted (i.e., the "LDD implant") as shallow regions prior to the formation of sidewall spacers 30 and 32, respectively. It is desirable to form these lightly doped regions at a thickness of under 1000 angstroms. Thereafter, sidewall spacers 30 and 32 are formed followed by a subsequent ion implant which forms diffused regions 34 and 36. As a result of this sequence of formation, lightly doped regions 38 and 40 will extend at least to gate edges 25a and 25b. However, there still remains the possibility that lightly doped regions 38 and 40 will diffuse laterally beyond gate edges 25a and 25b during subsequent thermal processing, thereby overlapping in the channel region underlying gate conductor 24. Therefore, the reach-through process also results in the possibility of sub-optimal transistor channel length. Further, again the depth of lightly doped regions 38 and 40 will contribute to problematic short-channel effects.

FIG. 2 illustrates an intermediate stage in the fabrication of the preferred transistor 42 of the present invention. A gate conductor 44, typically comprising polysilicon, is formed adjacent a semiconductor substrate 46. In the preferred embodiment, semiconductor substrate 46 is formed of a P type semiconductor material. A gate insulator 48, preferably formed of an oxide on the order of 250 angstroms in thickness, is formed between gate conductor 44 and semiconductor substrate 46. Gate conductor 44 defines gate edges 50a and 50b extending downwardly into semiconductor substrate 46 and colinear with the sides of gate conductor 44. Sidewall spacers 52 and 54 are formed at the sides of gate conductor 44 and adjacent semiconductor substrate 46. Typically, sidewall spacers 52 and 54 comprise an oxide material on the order of 4500 angstroms in thickness. Following the formation of sidewall spacers 52 and 54, diffused regions 56 and 58 are formed within semiconductor substrate 46 and away from gate edges 50a and 50b, respectively. Diffused regions 56 and 58 will initially incur a lateral "straggle" diffusion such that they slightly underlie the outward edge of sidewall spacers 52 and 54, respectively. Thereafter, transistor 42 is subjected to a thermal anneal in order to activate the dopants within diffused regions 56 and 58 and to anneal out the implant damage. Diffused regions 56 and 58 further diffuse laterally during this anneal but do not reach gate edges 50a and 50b. A void area 60 is defined between diffused region 56 and gate edge 50a. Similarly, a void area 62 is defined between diffused region 58 and gate edge 50b.

FIG. 3 illustrates the preferred transistor 42 of FIG. 2 having Positive charges (denoted as "+") trapped within sidewall spacers 52 and 54. The positive charges trapped within sidewall spacers 52 and 54 may be generated by exposing transistor 42 to radiation. Preferred types of radiation include either gamma radiation or X-ray radiation and may be provided at doses on the order of 10-100 kRad(Si). The radiation exposure results in positive charges being trapped within spacers 52 and 54. Trapping occurs along gate conductor 44 and more importantly, along the interface 64 between semiconductor spacers 52 and 54 and semiconductor substrate 46. As a result of the positive charge trapped along the spacer/substrate interface, negative charges (denoted as "−") are drawn to the spacer/substrate interface 64 primarily within semiconductor substrate 46 and partially within diffused regions 56 and 58. The negative charges will automatically self-align with the positive charges within sidewall spacers 52 and 54 and, therefore, will extend precisely to gate edges 50a and 50b, respectively. Therefore, the negative charges create an inversion layer within void areas 60 and 62. The inversion layer is less than 1000 angstroms in thickness, and is preferably on the order of 100 angstroms. The inversion layer provides an electrical connection between diffused regions 56 and 58 to gate edges 50a and 50b, respectively. Thus, the inversion layer effects an optimally aligned connection between diffused regions 56 and 58 and the transistor channel underlying gate conductor 44.

In an alternative embodiment of the present invention, the duration of the aforementioned anneal may be extended such that diffused regions 56 and 58 further diffuse laterally to directly contact gate edges 50a and 50b, respectively. This extension will eliminate void areas 60 and 62. Again, a subsequent radiation exposure causes positive charges to be trapped within sidewall spacers 52 and 54. Negative charges will again be drawn to interface 64 opposite sidewall spacers 52 and 54, but primarily within diffused regions 56 and 58 rather than within semiconductor substrate 46. In this instance, the negative charges will act primarily to reduce the series resistance associated with diffused regions 56 and 58 rather than to connect diffused regions 56 and 58 to gate edges 50a and 50b. Further, if any void area is inadvertently left between either diffused region 56 and 58 and the corresponding gate edge 50a and 50b, then the void will be filled by the inversion layer as discussed above.

It is therefore apparent that the present invention provides a transistor having self-aligned optimal connection between the diffused source/drain regions and the gate edges of the transistor. As a result, the electrical channel length of the transistor is substantially equal to the length of the gate conductor, thereby eliminating any possibility of overlap or underlap and the diminishing effects therefrom. Improved self-alignment of the contact to channel also insures low source/drain series resistance and reduces short channel effects because the effective source/drain depth under the sidewall spacers is very small. Further, as compared with the prior art reach-through LDD process, there is no need for the additional step of an LDD implant as heretofore required. Additionally, series resistance of the source/drain may be reduced by the presence of an inversion layer formed therein. Finally, the thickness of the inversion layer may be minimized to insure an efficient connection between the source/drain and the gate edges.

Although the present invention has been described in detail, it should be understood that various changes, substitutions and alterations can be made herein without departing from the spirit and scope of the invention as defined by the appended claims.

Where is claimed is:

1. A method of forming a transistor comprising:
   forming a gate conductor adjacent a semiconductor substrate defining first and second gate edges within the semiconductor substrate;
   forming a sidewall spacer adjacent the side of the gate conductor and the surface of the semiconductor substrate; and
   forming positive charges which are trapped within the sidewall spacer such that a negative charge layer is formed opposite the sidewall spacer, said step of forming positive charges trapped within the sidewall spacer comprising exposing the sidewall spacer to radiation.

2. The method of claim 1 and further comprising forming a gate insulator between the semiconductor substrate and the gate conductor.

3. The method of claim 1 and further comprising forming a diffused region within the semiconductor substrate and away from the first gate edge such that the negative charge layer will provide an electrical connection from the diffused region to the first gate edge.

4. The method of claim 3 wherein said step of forming the diffused region comprises forming N type semiconductor material.

5. The method of claim 3 wherein the diffused region comprises a first diffused region, the gate conductor has first and second sides, the negative charge layer comprises a first negative charge layer and the sidewall spacer comprises a first sidewall spacer adjacent the first side of the gate conductor, and further comprising:
   forming a second sidewall spacer adjacent the second side of the gate conductor and the surface of the semiconductor substrate;
   forming positive charges trapped within the second sidewall spacer such that a second negative charge layer is formed within the semiconductor substrate and opposite the second sidewall spacer; and
   forming a second diffused region within the semiconductor substrate and away from the second gate edge such that the second negative charge layer provides an electrical connection from the second diffused region to the second gate edge.

6. The method of claim 1 wherein said step of forming the sidewall spacer comprises forming an oxide sidewall spacer.

7. The method of claim 1 wherein said step of forming the semiconductor substrate comprises forming P type semiconductor material.

8. The method of claim 1 wherein said step of exposing to radiation comprises exposing the sidewall spacer to gamma radiation.

9. The method of claim 1 wherein said step of exposing to radiation comprises exposing the sidewall spacer to X-ray radiation.

10. The method of claim 1 wherein said step of exposing to radiation comprises exposing the sidewall spacer to radiation of approximately 10 to 100 kRad(Si).

11. The method of claim 1 and further comprising forming first and second diffused regions within the semiconductor substrate and contacting the first and second gate edges, respectively, wherein the negative charge layer is formed primarily within the first and second diffused regions.

12. A method of forming a transistor, comprising:
    forming a gate conductor adjacent a semiconductor substrate defining first and second gate edges outwardly from the gate conductor and within the semiconductor substrate;
    forming a first sidewall spacer adjacent a first side of the gate conductor and the surface of the semiconductor substrate;
    forming a second sidewall spacer adjacent a second side of the gate conductor and the surface of the semiconductor substrate; and
    trapping positive charges within the first and second sidewall spacers such that first and second negative charge layers are formed within the semiconductor substrate opposite the first and second sidewall spacers, respectively, said step of forming positive charges trapped within the sidewall spacer comprising exposing the sidewall spacer to radiation.

13. The method of claim 12 and further comprising forming a gate insulator between the semiconductor substrate and the gate conductor.

14. The method of claim 12 and further comprising:
    forming a first diffused region within the semiconductor substrate and away from the first gate edge such that the first negative charge layer will provide an electrical connection from the diffused region to the first gate edge; and
    forming a second diffused region within the semiconductor substrate and away from the second gate edge such that the second negative charge layer will provide an electrical connection from the diffused region to the second gate edge.

15. The method of claim 12 wherein said step of forming the first and second diffused regions comprises forming N type semiconductor material.

16. The method of claim 12 wherein said step of forming the first and second sidewall spacers comprises forming oxide sidewall spacers.

* * * * *